United States Patent
Wei

(10) Patent No.: US 8,087,456 B2
(45) Date of Patent: Jan. 3, 2012

(54) METHOD FOR MANUFACTURING HEAT SINK HAVING HEAT-DISSIPATING FINS AND STRUCTURE OF THE SAME

(75) Inventor: Wen-Chen Wei, Taipei Hsien (TW)

(73) Assignee: Neng Tyi Precision Industries Co., Ltd., Taipei Hisen (TW)

( * ) Notice: Subject to any disclaimer, the term of this patent is extended or adjusted under 35 U.S.C. 154(b) by 968 days.

(21) Appl. No.: 12/073,720

(22) Filed: Mar. 10, 2008

(65) Prior Publication Data

US 2009/0178794 A1    Jul. 16, 2009

(30) Foreign Application Priority Data

Jan. 16, 2008  (TW) ................................ 97101661 A

(51) Int. Cl.
*F28F 7/00*    (2006.01)
(52) U.S. Cl. ...................... 165/185; 165/80.3; 29/890.03
(58) Field of Classification Search .................. 165/80.1, 165/80.2, 80.3, 80.4, 185; 29/890.03, 890.031, 29/890.039
See application file for complete search history.

(56) References Cited

U.S. PATENT DOCUMENTS

| | | | | |
|---|---|---|---|---|
| 3,148,441 A | * | 9/1964 | Schuler | 165/181 |
| 3,216,496 A | * | 11/1965 | Katz | 165/185 |
| 3,305,013 A | * | 2/1967 | Friedl et al. | 165/183 |
| 5,014,776 A | * | 5/1991 | Hess | 165/185 |
| 5,542,176 A | * | 8/1996 | Serizawa et al. | 165/185 |
| 5,638,715 A | * | 6/1997 | Lipinski | 29/890.03 |
| 5,771,966 A | * | 6/1998 | Jacoby | 165/185 |
| 5,819,407 A | * | 10/1998 | Terada | 29/890.03 |
| 6,098,279 A | * | 8/2000 | Lee | 165/185 |
| 6,263,956 B1 | * | 7/2001 | Tang et al. | 165/80.3 |
| 6,266,245 B1 | * | 7/2001 | Wei | 165/185 |
| 6,269,003 B1 | * | 7/2001 | Wen-Chen | 165/80.3 |
| 6,336,498 B1 | * | 1/2002 | Wei | 165/80.3 |
| 6,386,275 B1 | * | 5/2002 | Kuo et al. | 165/80.3 |
| 6,554,060 B2 | * | 4/2003 | Noda et al. | 165/80.3 |
| 6,587,341 B1 | * | 7/2003 | Wei | 165/80.3 |
| 6,633,484 B1 | * | 10/2003 | Lee et al. | 165/185 |
| 6,681,847 B1 | * | 1/2004 | Lee | 165/185 |
| 6,742,581 B2 | * | 6/2004 | Mochizuki et al. | 165/185 |
| 6,748,656 B2 | * | 6/2004 | Woerner et al. | 29/890.03 |
| 6,758,262 B2 | * | 7/2004 | Kawabata et al. | 165/185 |
| 6,776,224 B1 | * | 8/2004 | Chen | 165/185 |
| 7,028,757 B1 | * | 4/2006 | Hegde | 165/185 |
| 7,497,013 B2 | * | 3/2009 | Zaghlol | 29/890.03 |
| 7,918,587 B2 | * | 4/2011 | Hsu et al. | 165/185 |
| 7,963,035 B2 | * | 6/2011 | Wei | 29/890.039 |
| 2004/0118552 A1 | * | 6/2004 | Huang et al. | 165/80.3 |
| 2005/0211416 A1 | * | 9/2005 | Kawabata et al. | 165/80.3 |
| 2007/0084595 A1 | * | 4/2007 | Lin et al. | 165/185 |
| 2009/0178795 A1 | * | 7/2009 | Wei | 165/185 |

* cited by examiner

*Primary Examiner* — Ljiljana Ciric
(74) *Attorney, Agent, or Firm* — Rosenberg, Klein & Lee

(57) ABSTRACT

A method for manufacturing a heat sink having heat-dissipating fins and a structure of the same are provided. The method includes the steps of: providing a substrate comprising a center portion and a plurality of extending arms, a gap being provided between each two adjacent extending arms; providing a plurality of heat-dissipating fins, the heat-dissipating fins being inserted into the gaps between the extending arms, each heat-dissipating fin comprising a base piece and two heat-dissipating plates; and bending and pressing each extending arm of the substrate with one of the two opposite side walls of each extending arm abutting against one of the two opposite surface of each heat-dissipating plate. Via the above arrangement, the present invention has an effect of avoiding the heat transfer loss.

4 Claims, 7 Drawing Sheets providing a substrate comprising a center portion and a plurality of extending arms, a gap being provided between each extending arm and two adjacent extending arms providing a plurality of heat-dissipating fins, the heat-dissipating fins being inserted into the gaps between the corresponding extending arms of the substrate, the two heat-dissipating plates of each heat-dissipating fin being inserted into the gaps between the corresponding extending arm and two adjacent extending arms bending and pressing each extending arm of the substrate with one of the two opposite side walls of each extending arm abutting against one of the two opposite surfaces of each heat-dissipating plate

FIG. 2

METHOD FOR MANUFACTURING HEAT SINK HAVING HEAT-DISSIPATING FINS AND STRUCTURE OF THE SAME

BACKGROUND OF THE INVENTION

1. Field of the Invention

The present invention is related to a method for manufacturing a heat sink having heat-dissipating fins and a structure of the same, and in particular to a method for manufacturing a heat sink having heat-dissipating fins and a structure of the same whereby solder for welding the heat-dissipating fins can be avoided.

2. Description of Related Art

Heat sinks are widely used with heat-generating electronic elements such as CPUs or lamps (e.g. halogen lamp, LED lamp etc.), thereby facilitating heat dissipation. The heat sink having heat-dissipating fins is the most popular heat sink. FIG. 1 shows a conventional heat sink, in which a plurality of heat-dissipating fins 13 is arranged equidistantly on the top surface 111 of a base 11 by means of soldering.

The heat-dissipating fins 13 are used to increase the heat-dissipating area. With the bottom surface 112 of the base 11 contacting a heat source, the base 11 absorbs the heat and transmits the heat rapidly to surfaces 131 of each heat-dissipating fin 13, thereby facilitating the heat dissipation.

Since the heat-dissipating fins 13 are welded on the top surface 111 of the base 11, and the heat transfer coefficient of the solder 12 is different from that of the base 11 or the heat-dissipating fins 13, the solder 12 may cause some heat transfer loss when the heat is transmitted to the heat-dissipating fins 13, which affects the heat-dissipating effect of the heat-dissipating fins 13. Therefore, it is an important issue to develop a heat sink that is capable of dissipating the heat efficiently.

Consequently, because of the above technical defects, the inventor keeps on carving unflaggingly through wholehearted experience and research to develop the present invention, which can effectively improve the defects described above.

SUMMARY OF THE INVENTION

In view of the above problems, the object of the present invention is to provide a method for manufacturing a heat sink having heat-dissipating fins and a structure of the same, whereby the solder can be avoided to reduce the heat transfer loss and the heat dissipation of electronic elements can be achieved.

According to one aspect of the present invention, the present invention provides a method for manufacturing a heat sink having heat-dissipating fins, which includes the steps of: providing a substrate comprising a center portion and a plurality of extending arms, the center portion having a top surface, a bottom surface and side walls, the extending arms extending from the side walls of the center portion with a gap provided between each extending arm and two adjacent extending arms; providing a plurality of heat-dissipating fins, the heat-dissipating fins being inserted into the gaps between the corresponding extending arms of the substrate, each heat-dissipating fin comprising a base piece and heat-dissipating plates connected on both sides of the base piece, the two heat-dissipating plates of each heat-dissipating fin being inserted into the gaps between the corresponding extending arm and two adjacent extending arms, each heat-dissipating plate having a top end and a bottom end; and bending and pressing each extending arm of the substrate with one of the two opposite side walls of each extending arm abutting against one of the two opposite surfaces of each heat-dissipating plate, the top and bottom ends of the two heat-dissipating plates of each heat-dissipating fin protruding from the top and bottom surfaces of the substrate.

Alternatively, in the above-mentioned steps, two substrates that are overlapped with each other can be provided. Each extending arm of one of the substrates corresponds to each gap of the other substrate. Each heat-dissipating fin is inserted into the gap between the two corresponding extending arms of the two substrates.

According to another aspect of the present invention, the present invention further provides a structure of a heat sink having heat-dissipating fins, which includes: a substrate comprising a center portion and a plurality of extending arms, the center portion having a top surface, a bottom surface and two side walls, the extending arms extending from the side walls of the center portion with a gap provided between each extending arm and two adjacent extending arms; and a plurality of heat-dissipating fins each comprising a base piece and heat-dissipating plates connected on both sides of the base piece, each heat-dissipating plate having a top end and a bottom end, both heat-dissipating plates of each heat-dissipating fin being inserted into the gap between the corresponding extending arm and two adjacent extending arms, one of the two opposite side walls of each extending arm abutting against one of the two opposite surfaces of each heat-dissipating plate, the top and bottom ends of the two heat-dissipating plates of each heat-dissipating fin protruding from the top and bottom surfaces of the substrate.

Alternatively, two substrates can be provided and they are overlapped with each other. Each extending arm of one substrate corresponds to each gap of the other substrate. The two heat-dissipating plates of each heat-dissipating fin are inserted into the gaps between the corresponding extending arm and two adjacent extending arms of the two substrates.

The present invention has advantageous effects as follows. Since the heat-dissipating fins are inserted into the gaps respectively between each extending arm of the substrate, and the two side walls of each extending arm abut against and thus fix the heat-dissipating plate and the heat-dissipating fin, in comparison with the prior art of welding the heat-dissipating fins by solder, the present invention avoids the heat transfer loss caused by solder. Further, the overall manufacturing steps of the present invention are simple without increasing the difficulty in assembling and manufacturing processes.

Next, the top surface or bottom surface of the substrate, or one top surface or bottom surface of the two substrates can be adhered to contact heat-generating electronic elements. The top and bottom ends of each heat-dissipating plate protrude from the top and bottom surfaces of the substrate. Via this arrangement, the cooling airflow or the airflow of a heat source can be flowed into/out of the top and bottom surfaces of the substrate in two ways. In this way, the heat dissipation of the electronic elements can be achieved more easily.

In order to further understand the techniques, methods and effects employed by the present invention to achieve the desired objects, a detailed description relating thereto will be made with reference to the accompanying drawings. In this way, the objects, characteristics and features of the present invention can be appreciated more thoroughly. However, the drawings are illustrative only, but not used to limit the scope of the present invention.

BRIEF DESCRIPTION OF THE DRAWINGS

FIG. 2 is a flow chart of the method of the present invention;

DETAILED DESCRIPTION OF THE PREFERRED EMBODIMENTS

Figure 1:
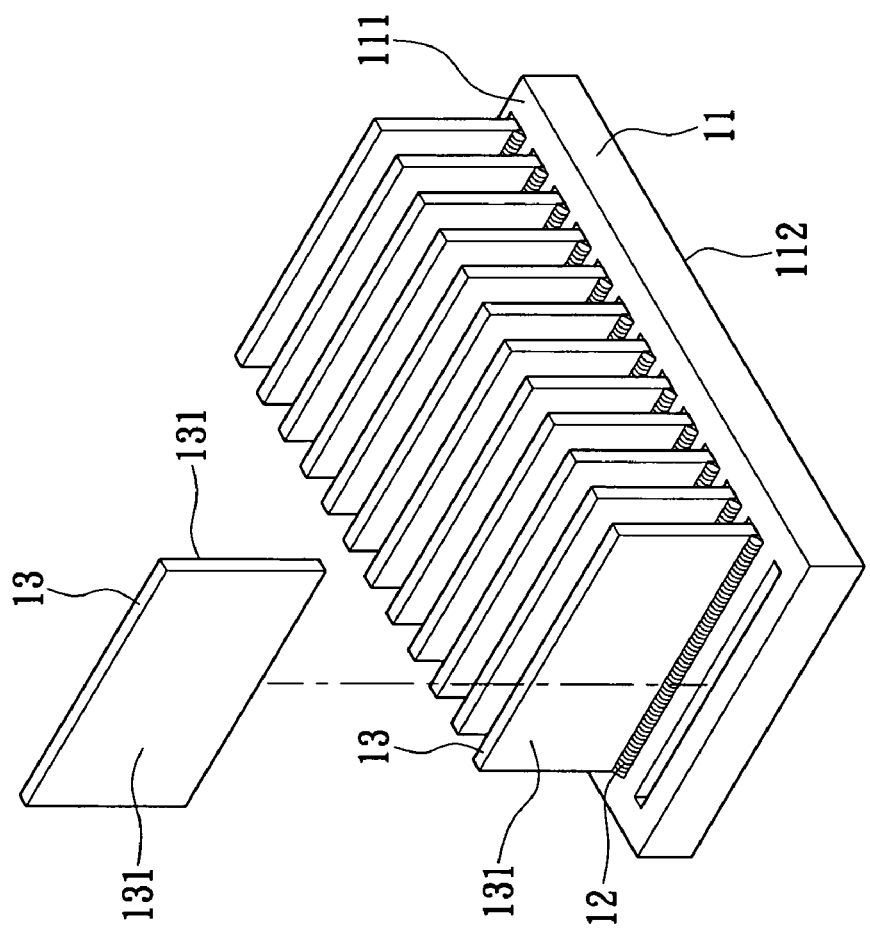
FIG. 1 is a perspective view showing a conventional heat sink.
Figure 4:
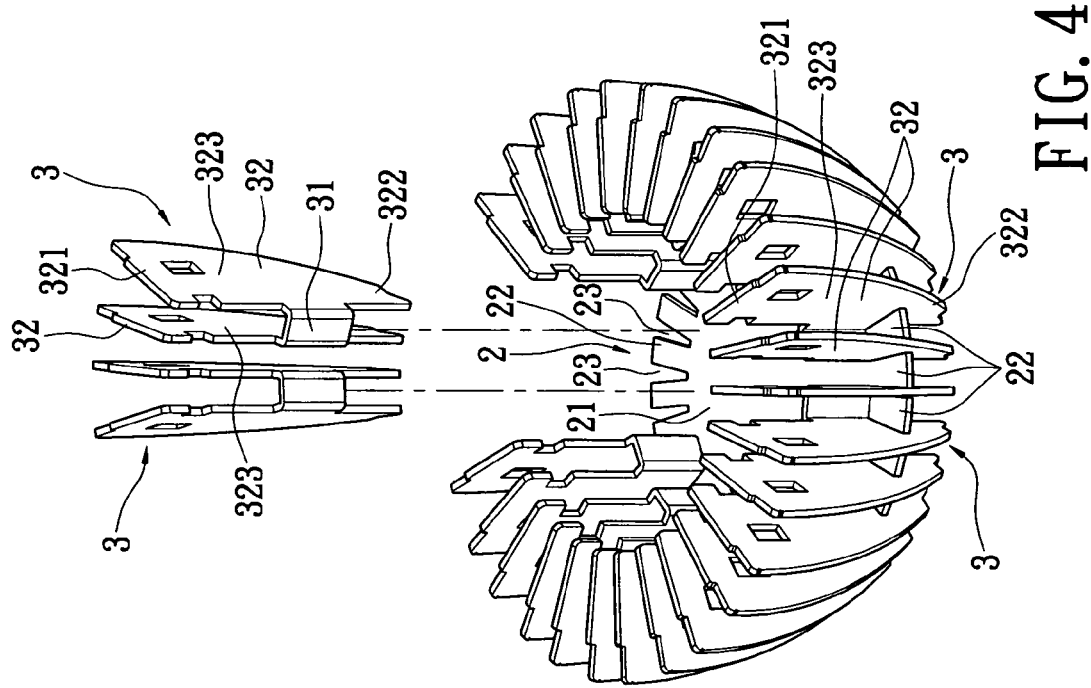
FIG. 4 is a partially exploded perspective and assembled view showing the substrate and the heat-dissipating fins of the present invention.
Figure 3:
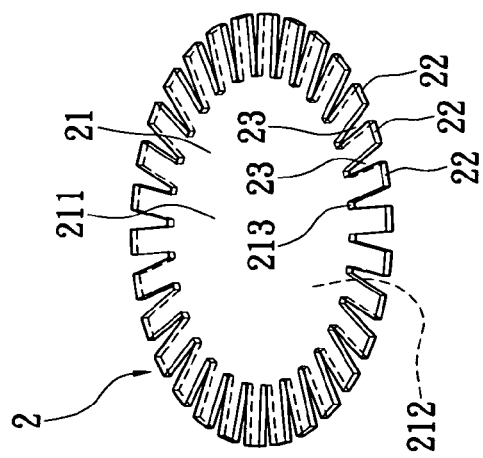
FIG. 3 is a perspective view showing the substrate of the present invention.
Figure 5:
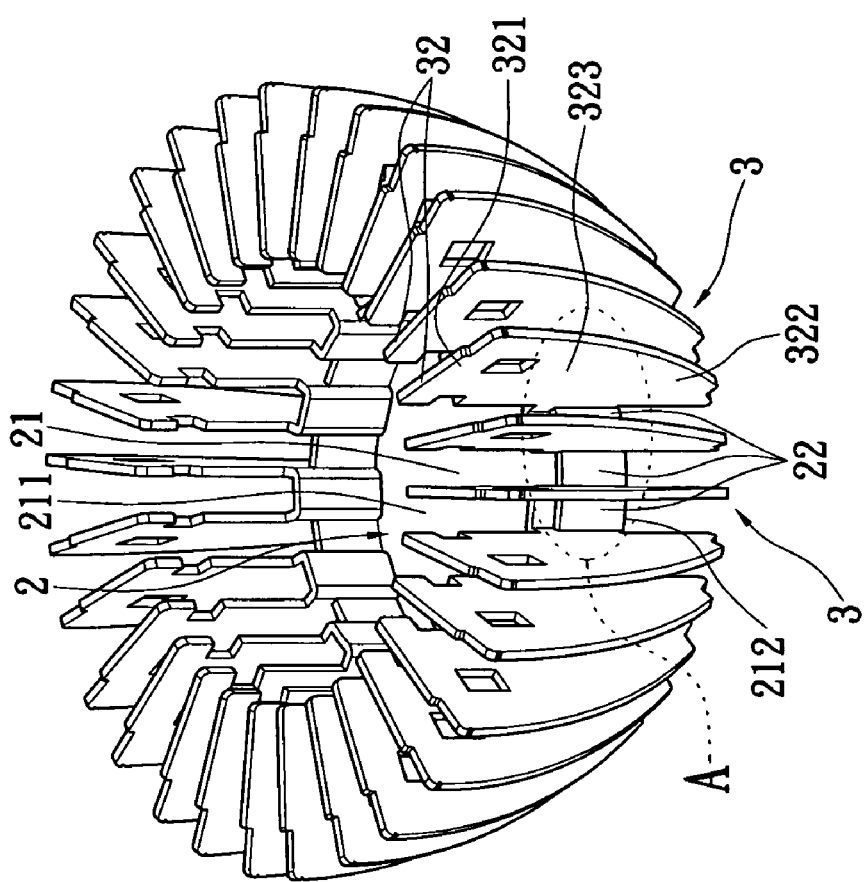
FIG. 5 is an assembled perspective view showing the substrate and the heat-dissipating fins of the present invention.

Please refer to FIGS. 2 to 5. The present invention provides a method for manufacturing a heat sink having heat-dissipating fins and a structure of the same. The method includes the steps as follows.

(1) A substrate 2 is provided. The substrate 2 comprises a center portion 21 and a plurality of extending arms 22. The center portion 21 has a top surface 211, a bottom surface 212 and side walls 213. The extending arms 22 extend from the side walls 213 of the center portion 21. A gap 23 is provided between each extending arm 22 and two adjacent extending arms 22 respectively.

(2) A plurality of heat-dissipating fins 3 is provided. The heat-dissipating fins 3 are inserted into the gaps 23 between the corresponding extending arms 22 of the substrate 2 respectively. Each heat-dissipating fin 3 comprises a base piece 31 and two heat-dissipating plates 32 connected on both sides of the base piece 31.

The two heat-dissipating plates 32 of each heat-dissipating fin 3 are inserted into the gaps 23 between the corresponding extending arm 22 and the two adjacent extending arms 22 respectively. Each heat-dissipating plate 32 has a top end 321 and a bottom end 322.

Figure 6:
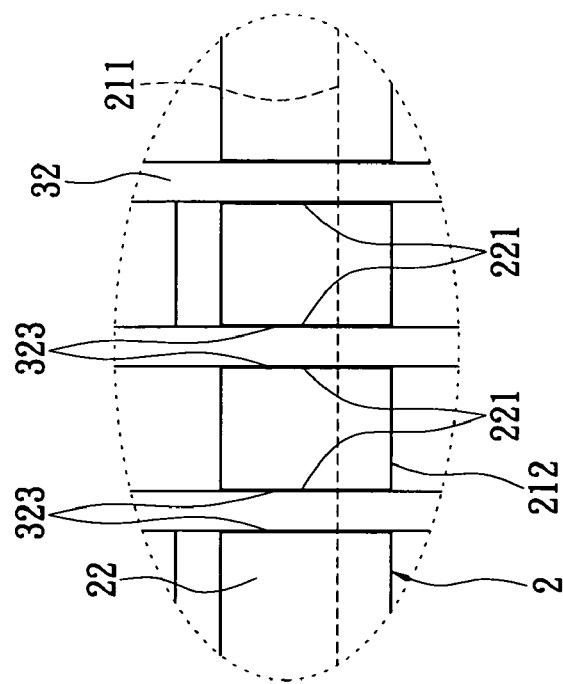
FIG. 6 is a front view showing the portion A of FIG. 5.

(3) Each extending arm 22 of the substrate 2 is bent and pressed, so that one of the two opposite side walls 223 of each extending arm 22 abuts against one of the two opposite surfaces 323 of each heat-dissipating plate 32, as shown in FIG. 6. At the same time, the top and bottom ends 321, 322 of the two heat-dissipating plates 32 of each heat-dissipating fin 3 protrude from the top and bottom surfaces 211, 212 of the center portion 21 of the substrate 2. In this way, a heat sink product can be obtained.

In the above step (3) of bending and pressing, the free end of each extending arm 22 is bent (upwardly or downwardly, and an upward bending is shown in the present invention) toward the center portion 21, so that each extending arm 22 is bent to point upwards or downwards from the side walls 213 of the center portion 21. Further, each extending arm 22 is pressed in such a manner that both side wall surfaces 221 abut against the heat-dissipating plates 32 of the corresponding heat-dissipating fin 3. In this way, each heat-dissipating fin 3 can be fixed to the side edge of the center portion 21 firmly.

According to the above description, the structure of the heat sink of the present invention includes the above substrate 2 and a plurality of heat-dissipating fins 3. Each extending arm 22 of the substrate 2 is bent to extend from the side walls 213 of the center portion 21. A gap 23 is formed between each extending arm 22 and two adjacent extending arms 22 respectively. Each heat-dissipating fin 3 is provided in the gap 23 between the corresponding extending arms 22 of the substrate 2. One of the two side wall surfaces 221 of each extending arm. 22 abuts against one of the two surfaces 323 of each heat-dissipating plate 32. The top end 321 and the bottom end 322 of the two heat-dissipating plates 32 of each heat-dissipating fin 3 protrude from the top surface 211 and the bottom surface 212 of the substrate 2.

The center portion 21 of the above substrate 2 can be a circular plate. Thus, each extending arm 22 is radially provided on the side walls 213 of the circular plate-like center portion 21. Of course, the above center portion 21 can be a polygonal plate (such as quadrangle). The extending arms 22 are formed to extend from each side wall 213 of the center portion 21 respectively. Preferably, the center portion 21 is a circular plate. Therefore, the above step (2) of inserting the heat-dissipating fins 3 can be performed automatically, thereby achieving mass production. More specifically, each heat-dissipating fin 3 can be inserted on the substrate 2 manually in sequence. Of course, the insertion can be performed automatically, thereby achieving mass production. In addition, the substrate 2 and the heat-dissipating fins 3 can be made of the same metallic material having a heat-dissipating effect, such as copper and aluminum.

Figure 7:
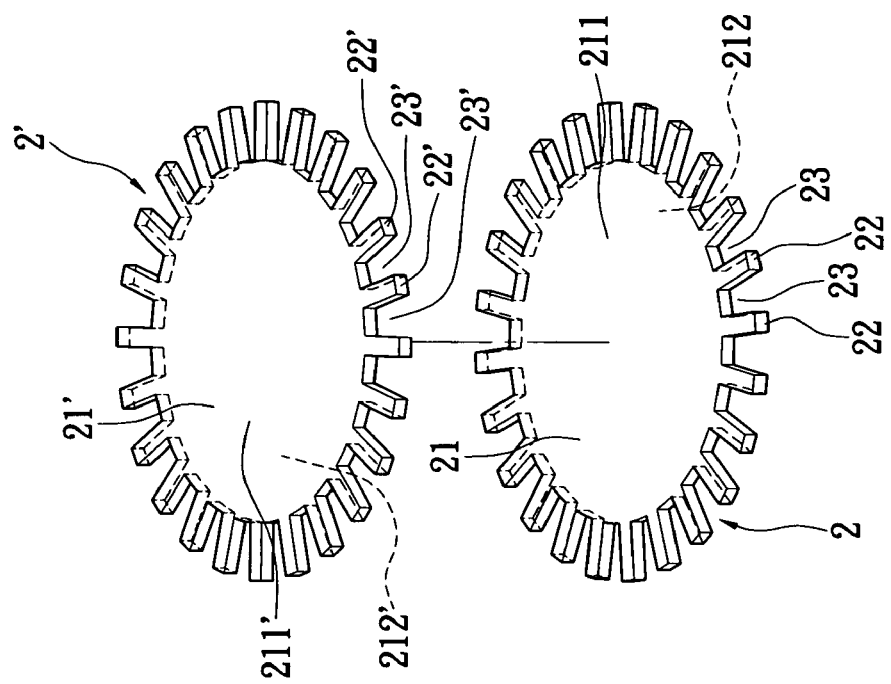
FIG. 7 is an exploded perspective view showing the substrate of another embodiment of the present invention.
Figure 9:
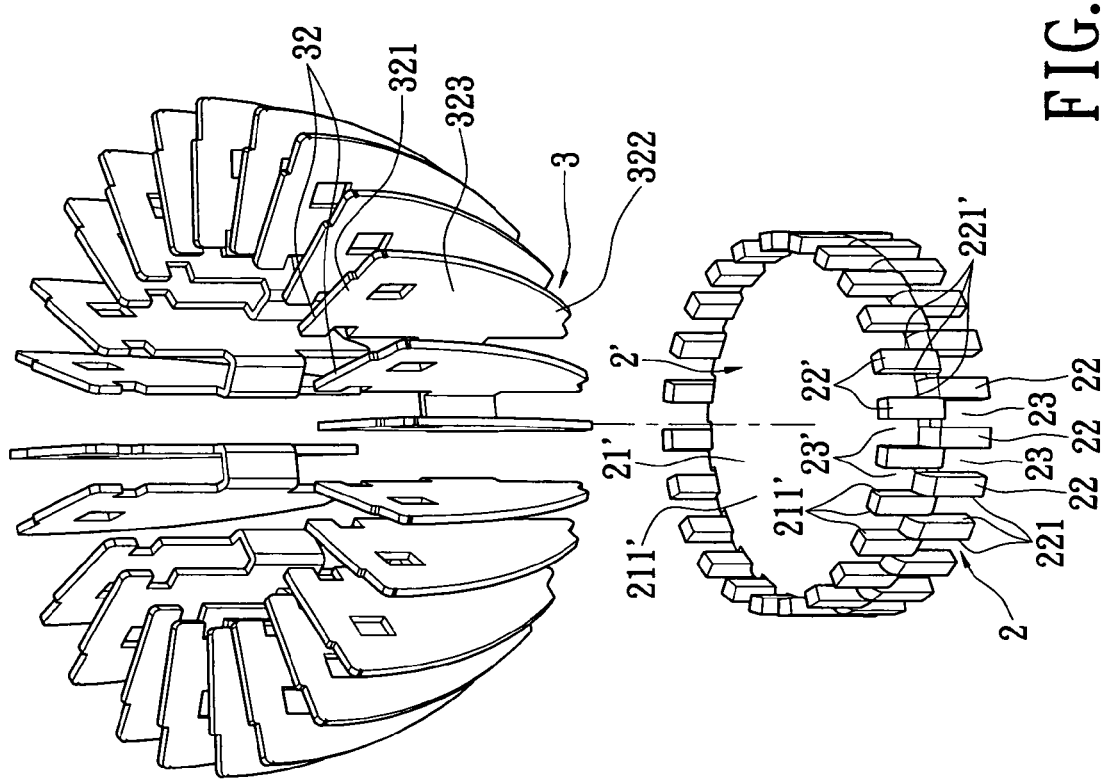
FIG. 9 is an exploded perspective view (II) showing the heat-dissipating fins and the substrate of another embodiment of the present invention.

Please refer to FIGS. 7 and 9, which show another embodiment. The difference between the present embodiment and the previous embodiment lies in that:

(1) Two substrates 2, 2' are provided. The two substrates 2, 2' are overlapped with each other. Each extending arm 22' of one substrate 2' corresponds to each gap 23 of the other substrate 2, so that the extending arms 22, 22' of the two substrates 2, 2' are arranged alternatively in the vertical direction.

(2) Each heat-dissipating fin 3 is inserted in the gaps 23, 23' of the corresponding extending arms 22, 22' of the two substrates 2, 2'. Both heat-dissipating plates 32 of each heat-dissipating fin 3 are inserted into the gaps 23, 23' between the extending arms 22, 22' and two adjacent extending arms 22, 22'.

(3) Each of the extending arms 22, 22' of the two substrates 2, 2' is bent and pressed, so that one of the two opposite side wall surfaces 221, 221' abuts against one of the two opposite surfaces 323 of each heat-dissipating plate 32.

Figure 8:
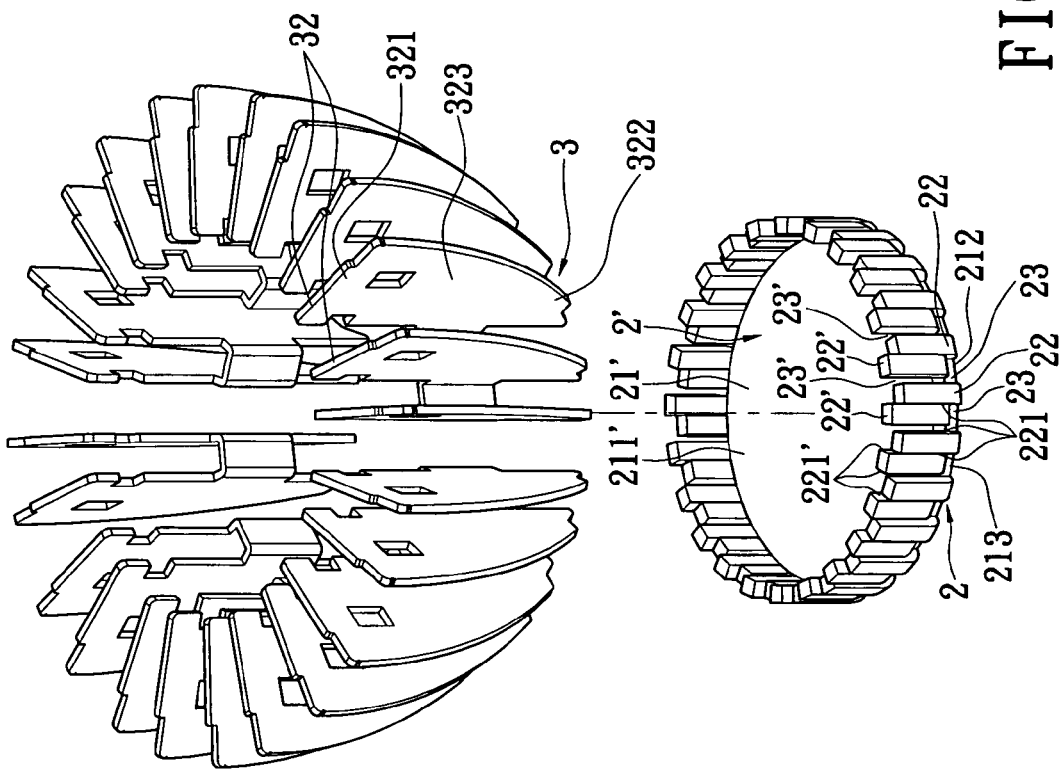
FIG. 8 is an exploded perspective view (I) showing the heat-dissipating fins and the substrate of another embodiment of the present invention.

As shown in FIG. 8, in the step (3) of bending and pressing of the present embodiment, the free ends of the extending arms 22, 22' of the two substrates 2, 2' are bent (upwardly or downwardly) toward the two center portions 21, 21' in the same direction. Alternatively, as shown in FIG. 9, the free ends of the extending arms 22, 22' of the two substrates 2, 2' are bent toward the two center portions 21, 21' in opposite directions. That is to say, the free end of each extending arm 22 of one substrate 2 is opposite to the free end of each extending arm 22' of the other substrate 2'.

According to the above, the structure of the heat sink of the present embodiment includes two substrates 2, 2' that are overlapped with other and a plurality of heat-dissipating fins 3. The extending arms 22, 22' of each substrate 2, 2' are bent to extend from the side walls 213, 213' of the center portions 21, 21'. Each extending arm 22' of one substrate 2' corresponds to each gap 23 of the other substrate 2.

Each heat-dissipating fin 3 is provided in the gaps 23, 23' between the corresponding extending arms 22, 22' of the two substrates 2, 2'. Two heat-dissipating plates 32 of each heat-dissipating fin 3 are inserted into the gaps 23, 23' between the corresponding extending arms 22, 22' and two adjacent extending arms 22, 22'. One of the two side wall surfaces 221, 221' of each extending arm 22, 22' abuts against one of the two opposite surfaces 323 of each heat-dissipating plate 32.

In addition, the free ends of the extending arms 22, 22' of the two substrates 2, 2' extend in the same direction. Alternatively, the free ends of the extending arms 22, 22' of the two substrates 2, 2' extend in opposite directions.

According to the above description, in the present invention, the heat-dissipating fin 3 is inserted into the gaps 23, 23' respectively between each extending arm 22, 22' of the substrate 2, 2', and the two side walls 221, 221' of each extending arm 22, 22' abut against and thus fix the heat-dissipating plates 32 and the heat-dissipating fins 3. In comparison with the prior art of welding the heat-dissipating fins by solder, the present invention avoids the heat transfer loss caused by solder. Further, the overall manufacturing steps of the present invention are simple without increasing the difficulty in assembling and manufacturing processes. Further, avoiding the solder conforms to the concept of environmental protection (because the solder usually contains lead, while the lead-free solder has increased cost.)

Next, the top surface 211 or bottom surface 212 of the substrate 2, or one top surface 211' or bottom surface 212 of the two substrates 2, 2' can be adhered to contact heat-generating electronic elements (such as LED lamp). The top and bottom ends 321, 322 of each heat-dissipating plate 32 protrude from the top surfaces 211, 211' and the bottom surfaces 212, 212' of the substrates 2, 2'. Via this arrangement, the cooling airflow or the airflow of a heat source can be flowed into/out of the top surface 211, 211' and the bottom surface 212, 212' of the substrate 2, 2' in two ways. In this way, the heat dissipation of the electronic elements can be achieved more easily.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A structure of a heat sink having heat-dissipating fins, comprising:

two substrates overlapped with each other, each substrate comprising a center portion and a plurality of extending arms, the center portion having a top surface, a bottom surface and two side walls, the extending arms extending from the side walls of the center portion with two gaps respectively provided between each extending arm and two adjacent extending arms, each extending arm of one substrate corresponding to each gap of the other substrate; and a plurality of heat-dissipating fins each comprising a base piece and heat-dissipating plates connected on both sides of the base piece, each heat-dissipating plate having a top end and a bottom end, both heat-dissipating plates of each heat-dissipating fin being inserted into the gaps between the corresponding extending arm and two adjacent extending arms, one of the two opposite side walls of each extending arm abutting against one of the two opposite surfaces of each heat-dissipating plate, the top and bottom ends of the two heat-dissipating plates of each heat-dissipating fin protruding from the top and bottom surfaces of the two substrates.

2. The structure of a heat sink having heat-dissipating fins according to claim 1, wherein each of the two center portions is a circular plate.

3. The structure of a heat sink having heat-dissipating fins according to claim 1, wherein free ends of the extending arms of the two substrates are bent in the same direction.

4. The structure of a heat sink having heat-dissipating fins according to claim 1, wherein free ends of the extending arms of the two substrates are bent in opposite directions.

* * * * *